United States Patent
Agarwal et al.

(10) Patent No.: US 6,711,140 B1
(45) Date of Patent: Mar. 23, 2004

(54) METHOD AND APPARATUS FOR FAST ACQUISITION AND SYNCHRONIZATION OF TRANSMISSION FRAMES

(75) Inventors: Anil K. Agarwal, Gaithersburg, MD (US); Sampath Kumar, Germantown, MD (US)

(73) Assignee: Comsat Corporation, Bethesda, MD (US)

( * ) Notice: Subject to any disclaimer, the term of this patent is extended or adjusted under 35 U.S.C. 154(b) by 0 days.

(21) Appl. No.: 09/462,892

(22) PCT Filed: Jul. 15, 1998

(86) PCT No.: PCT/US98/14197
§ 371 (c)(1),
(2), (4) Date: Apr. 25, 2000

(87) PCT Pub. No.: WO99/04515
PCT Pub. Date: Jan. 28, 1999

Related U.S. Application Data

(60) Provisional application No. 60/052,539, filed on Jul. 15, 1997.

(51) Int. Cl.[7] .............................. H04L 12/28; H04J 1/02; H04J 3/06; H04B 7/212
(52) U.S. Cl. .................. 370/324; 370/395.42; 370/412; 370/509; 375/356; 455/13.2
(58) Field of Search ................................ 370/230, 235, 370/338, 356, 412, 474, 470, 477, 395.2, 392, 394, 316, 395.42, 395.51, 395.52, 350, 509, 324; 375/368, 356; 714/789, 708; 455/13.2

(56) References Cited

U.S. PATENT DOCUMENTS

| | | | |
|---|---|---|---|
| 4,320,504 A | 3/1982 | Alvarez, III et al. | |
| 4,346,470 A | 8/1982 | Alvarez, III et al. | |
| 5,490,140 A | 2/1996 | Abensour et al. | |
| 5,490,141 A | 2/1996 | Lai et al. | |
| 5,592,518 A | 1/1997 | Davis et al. | |
| 5,600,653 A | 2/1997 | Chitre et al. | |
| 5,623,495 A | 4/1997 | Eng et al. | |
| 5,802,120 A * | 9/1998 | Muraoka | 375/362 |
| 6,088,346 A * | 7/2000 | Du et al. | 370/338 |
| 6,477,669 B1 * | 11/2002 | Agarwal et al. | 714/708 |

* cited by examiner

Primary Examiner—Duc Ho
(74) Attorney, Agent, or Firm—Sughrue Mion, PLLC

(57) ABSTRACT

A method and apparatus for providing frame acquisition and synchronization for ATM transmissions in terrestrial wireless and satellite systems. During acquisition (1020), the transmitter (15) fills the entire payload of a frame with a pattern that is used by the receiver (18) to determine the location of the frame boundary. As to synchronization (1020), a procedure is utilized for using frame sequence number field in the header and Reed-Solomon decoding result (1012) for correction and maintaining frame synchronization.

9 Claims, 10 Drawing Sheets

METHOD AND APPARATUS FOR FAST ACQUISITION AND SYNCHRONIZATION OF TRANSMISSION FRAMES

FIELD OF THE INVENTION

The present application is based on U.S. provisional application S. No. 60/052,539 filed on Jul. 15, 1997 and priority therefrom is claimed under 35 U.S.C. § 120. The entire content of U.S. Provisional Application S. No. 60-0520,539 is incorporated herein by reference.

The present invention relates to the efficient and reliable transmission of packet or cell-based information, such as frame relay, SS#7, ISDN, Internet or asynchronous transfer mode (ATM) based information, via wireless links. More specifically, the present invention relates to a method and apparatus for fast acquisition and synchronization of frames for transmission over satellite and wireless links without the use of any overhead pattern bits for acquisition or synchronization. While the present invention is applicable all of the foregoing and other similar types of cell or packet-based transmission formats, the ATM format will be the exemplary focus of one preferred embodiment for purposes of providing an enabling disclosure, written description and best mode for the present invention.

BACKGROUND OF THE INVENTION

There are a variety of methods for transmitting information via a broadband Integrated Services Digital Network (B-ISDN), using a variety of protocols related to Asynchronous Transport Mode (ATM), frame relay mode, Internet, ISDN and SS#7 modes of transmission. The ATM mode, as the exemplary preferred embodiment, is a method for transmitting information via a broadband Integrated Services Digital Network (B-ISDN). A group called the International Telephone and Telegraph Consultative Committee (CCITT) originally investigated this mode. The group, currently called the International Telecommunication Union—Telecommunications Standards Sector (ITU-TSS), investigated a new form of ISDN that would have the flexibility to accommodate a large number of channels and the ability to transfer large amounts of data at a very fast rate. At the end of the study, the committee decided to adopt ATM as the target transfer mode for the B-ISDN. The ITU-TSS is currently defining the wide area network (WAN) standards for ATM.

ATM is a transfer mode that sends 53 octet-sized packets of information across a network from one communication device to another. The 53 octets are assembled as a "cell", which comprises 48 octets of data information, referred to as the "payload", and 5 octets of "header" information (including the routing information). The header and data information must be organized into cells so that when the cells are filled, they can be sent when an open slot of 53 octets becomes available.

Within a system that transmits ATM cells or packets, the end-to-end connection along which the user sends data is conventionally identified as a virtual channel connection (VCC). The VCC is unidirectional but VCCs occur in pairs, thus making the connection bidirectional. Each virtual channel is within a virtual path (VP), meaning a group of virtual channels that are associated so as to be sent in the same direction. Each VC and VP have specially signed numbers called virtual channel identifiers (VCI) and virtual path identifiers (VPI), respectively. These numbers help the system determine the direction in which the cell should be sent or where the cell belongs.

There are two forms of headers that are specified in the CCITT Recommendation I.361. Each form is 5 octets long. There also are two different ATM network connections, each one having a different type of header. One connection form is the user-network interface (UNI), which is used between the user installation and the first ATM exchange and also within the user's own network. The other form of connection is the network-node interface (NNI) which is used between the ATM exchanges in the trunk network. The header format for the UNI consists of the following field:

Generic flow control (GFC) field of 4 bits. It can provide flow control information towards the network from an ATM endpoint.

Routing field of 24 bits. Eight of the bits are VPI (virtual path identifiers) and 16 bits are VCI (virtual channel identifier). Empty cells with both the VCI and VPI set to zero indicates that the cell is unassigned.

Payload type (PT) field of 3 bits. This field is used to provide information on whether the cell payload contains user information or network information. This field is used by the network to intercept any important network information.

Cell loss priority (CLP) field containing 1 bit. This field may be set by the user or service provider to indicate lower priority cells. If the bit is set to 1 the cell is at a risk of being discarded by the network during busy times.

Header error control (HEC) field of 8 bits. This field is processed by the physical layer to detect errors in the header. The code used for this field is capable of either single-bit error-correction or multiple-bit error-detection.

As seen in FIGS. 1A and 1B, the header format for the NNI is the same as the header information of the UNI except that there is no GFC, and the VPI of the routing field is 12 bits instead of 8 bits.

Error detection occurs only within the header message. No error detection of the data occurs within the information portion of the cell. The receiving endpoint determines whether the data can be corrected or whether it must be discarded. When a link or node becomes busy, an ATM network must discard cells until the problem is resolved. The first cells to be discarded are the cells that have a CLP bit in the header set to a "1". Since connection endpoints are not notified when a cell is discarded, higher layers of protocols are needed to detect and recover from errors.

A cell is sent along a channel called a Virtual Channel Connection (VCC). A VCC consists of a series of links that establish a unidirectional connection through the network that allows the flow of information from one endpoint to another endpoint. Cells on a VCC always follow the same path through the network. Therefore, each cell arrives at its destination in the same order in which it was transmitted. VCCs can be unidirectional or may occur in pairs, thus making the connection bi-directional. VCCs can be within a Virtual Path Connection (VPC), meaning a group of virtual channels that are associated together, so as to be sent as a large trunk for a part of network. The VCCs are multiplexed and demultiplexed at appropriate network nodes in the network. Each VCC and VPC have specially assigned numbers called Virtual Channel Identifiers (VCI) and Virtual Path Identifiers (VPI), respectively. These numbers help the system determine the direction in which the cells belonging to the connection should be sent and which applications should be associated with the connection.

Although cell- or packet-based transmission, switching, and network technology has been employed in broadband integrated services digital networks (B-ISDN) which rely on fiber optics, there are numerous difficulties associated with implementing such cell- or packet-based technology in a wireless communication network. These difficulties include the fact that cell- or packet-based networks and switches rely on a number of high-speed interfaces. These high-speed standard interfaces include OC-3 (155 Mbit/s), OC-12 (622 Mbit/s) and DS3 (45 Mbit/s). However a few cell- or-packet-based networks and switches support lower speed interfaces, such as T1 (1.544 Mbit/s) and the programmable rate RS-449 interface.

As a consequence, there are only a few interfaces which can support the comparatively low transmission rates (less than 1 Mbit/s to 8 Mbit/s) used in wireless communication. Although commercial satellite and wireless modems support these low transmission rates using an RS-449 programmable rate interface, it is difficult to implement-cell- or packet-based technology in a wireless environment using conventional interfaces because most cell or packet traffic, such as ATM, is transmitted over high rate data interfaces.

Another difficulty associated with implementing cell- or packet-based technology in a wireless communication network has to do with the fact that cell- or packet-based protocols rely on extremely low bit error ratios which are typical of fiber optics based networks. By way of example, ATM protocols assume that the transmission medium has very low Bit Error Ratios (BER) ($10^{-12}$) and that bit errors occur randomly.

In contrast, the bit error ratios associated with wireless communication are much higher (on the order of $10^{-3}$ to $10^{-8}$) and tend to fluctuate in accordance with atmospheric conditions. In addition, the errors associated with wireless communication tend to occur in longer bursts. Thus, a robust error correction scheme must be employed in a wireless network in which cell- or packet-based technology is to be implemented.

In addition to the difficulties discussed above, there is another significant constraint placed on wireless communication networks which is not imposed on terrestrial based fiber optics networks. This constraint has to do with the fact that the cost of bandwidth in a wireless network is much higher than for fiber optics networks. As a consequence of having been traditionally implemented in fiber optics networks, for example, ATM based technology is not particularly efficient in its use of transmission bandwidth. Therefore, if ATM-based technology is to be implemented in wireless networks, it must achieve a more efficient use of bandwidth. One basis for such inefficiencies arises from the use of traditional signal acquisition and synchronization techniques.

Transmission links need a technique for formatting frames such that a receiver of a bit stream can recognize the boundaries where frames begin in the bit stream. Most systems accomplish this by inserting some additional bits in the bit stream which are dedicated to this purpose. Specialized hardware is used at the receiver to search for this pattern in the bit stream. It takes several samplings of the bit stream before frame boundaries are reliably recognized. These techniques lead to a loss of bandwidth, expensive hardware and a long time to achieve synchronization, especially over low speed links.

For example, there are various traditional methods used for frame synchronization in ATM, synchronous circuit systems and packet transfer systems. Many non-cell and non-packet systems, use special synchronization bits in the bit stream to achieve synchronization. ATM uses a self-delineation scheme, whereby the error detection capability of the ATM cell header checksum is used as an indication of cell synchronization. All methods generally require dedicated hardware implementations to search for the synchronization pattern and to retain synchronization. Most systems require sampling of several frames to achieve acquisition, which is of not much concern in high speed links, but is detrimental in low speed links.

Other primary access interfaces include ISDN/SS#7 (for switched digital circuits, voice, fax and video conferencing), Internet and "frame relay" (for LAN interconnection and Internet access) using TCP/IP or other LAN protocols. Considerations similar to those for ATM are relevant to the transmission of traffic using these other interfaces, as exemplified by the transmission of frame/relay traffic over satellite/wireless networks, although some differences are known in the art. For example, unlike ATM cells, frame relay packets are variable lengths. Thus, the frame formats used to communicate between the satellite/wireless terminals are arranged to transport variable length packets efficiently.

As explained in the U.S. Provisional Application S. No. 60-052,359, which is incorporated herein by reference, the frame/relay uses a robust, flexible frame format between two communicating terminals which allows the transport of several variable sized Spackets (segmented packets) in a frame and also allows a single Spacket to be carried over several frames, whichever the case might be. Also, the frame format allows fast synchronization and the exchange of coding information. Each frame contains Reed-Solomon (RS) check bytes that are used for error correction and to enhance the quality of the satellite/wireless link. The number of RS check bytes in a frame can be changed on the fly, without any loss of data, to compensate for varying link conditions. The decision to change the RS check bytes in a frame is based on the constant monitoring of the link quality. Several frames are also interleaved before transmission over the satellite/wireless link, to help spread the effect of burst errors over several frames, all of which can then be corrected by the FEC in the frames.

Also, Virtual Channels (VCs) can be configured to be enabled for data. compression, which means that the Spackets belonging to the VC are passed through a data compressor/decompressor combination to save bandwidth VCs can also be configured to be either high or low priority VCs and the scheduler then, uses this information to fairly transmit the various Spackets over the satellite/wireless link. To minimize the large delays introduced by the transmission of low priority packets on a low bit rate link, and the delay experienced by high priority packets which are waiting to be scheduled, the Spacket allows the segmentation of large packets into several, smaller Spackets. The delays experienced by high priority packets are substantially reduced. This also allows for efficient implementation of the compression and decompression modules.

The frame relay arrangement using Spackets also faces the problem of efficiently using bandwidth in a wireless network. Therefore, if frame relay (Spacket)-based technology is to be implemented in wireless networks, it must achieve a more efficient use of bandwidth. These same goals apply to ISDN/SS#7 transmissions, Internet transmissions and those generally using TCP/IP protocols. However, no solution to problems blocking achievement of these goals is seen in the prior art.

U.S. Pat. No. 5,568,482 relates to a low speed radio link system and method designed for ATM transport. The system is based on a data protocol that is compatible with non-wireless ATM based data transmission systems. The data protocol incorporates a frame format that allows for the transmission of ATM cells in low speed, high noise links. However, the data protocol is rigid and does not account for partial or compressed cells. Similarly, this prior art scheme fails to accommodate flexible data-payloads or flexible block codes for error correction. The problems of conventional ATM-synchronization in a low speed noisy environment are avoided by establishing a data frame with 45 ATM cells in its payload and by using a 7-byte header and individual 1-byte subframe headers, with each subframe having 5 53-byte ATM cells. The 2400 byte frame is sized to have an integer relationship with the standard 8 kHz sync clocks, and the framing header serves to indicate the start of a frame. The frame header can also have one byte to represent standard BIP-8 for the previously sent frame. The 1-byte subframe header can also provide a periodically repeating framing information that can serve synchronization. Because the framing structure is at predictable ATM cell locations, and are repeated continuously there, rapid re-synchronization can be achieved. Moreover, the internal ATM cell checksum present in the standard ATM cell can verify error free transmission.

A further prior art technique for synchronization in a wireless ATM network is called the Limitless ATM Network (LANET) protocol. The LANET protocol is combined with the Reed-Solomon forward error correction scheme and simple error tolerant addressing (multiple redundancy addressing). The LANET provides a framing structure around ATM cells for transmission purposes and provides a regular frame Mbit pattern for cell extraction. A 15 byte overhead, which includes LANET frame and subframe headers, are used in conjunction with traditional cell header error detection methods (HEC) to enhance cell delineation in noisy environments. Rather than using block error correction schemes to protect the header, LANET uses error-tolerant addressing schemes (multiple redundancy addressing) so that multiple virtual circuits to the same destination are established. The LANET protocol is touted to have the ability to sort quickly through the bits to locate headers that obey a certain periodicity constraint because they are simple, predictable and have reasonable chance of surviving noise.

However, the present invention and the prior art differ in both the framing and content of the transmission, and thus would differ in the algorithms applied for synchronization and acquisition. First, the framing composition in the present invention does not utilize a single frame header for a group of frames, but uses a header for each frame and appends RS checking onto each frame. This differs from the subframes used in the prior art, which rely on only a single bit of overhead per subframe but require a shared header of 7 bytes. Although the prior art does teach reliance on both error correction decoding and use of other frame header information every frame to maintain frame synchronization, there is no teaching of the algorithm used and, even on the basis of the limited disclosure, there would be a difference from that proposed in the present disclosure.

SUMMARY OF THE INVENTION

The present invention overcomes the above-mentioned problems associated with implementing cell or packet-based technology in a wireless communication network by providing a frame format for a communication signal containing a bit stream, such as one including asynchronous transfer mode (ATM) formatted data.

The present invention also overcomes the above-mentioned problems associated with implementing frame relay-based technology in a wireless communication network, carrying frame relay formatted data supported by TCP/IP and other LAN protocols, by providing a frame format for a communication signal containing a bit stream including Spacket formatted data.

The present invention also overcomes the above-mentioned problems associated with implementing ISDN/SS#7-formatted data in a wireless communication network, by providing a frame format for a communication signal containing a bit stream including appropriately formatted data.

In the ATM environment, the invention concerns a portion of the ATM Link. Accelerator (ALA), which is located between the ATM switch and the WAN transmission device. The ALA design is based upon an architecture and frame structure which encompasses adaptive rate interfaces, Reed-Solomon coding and decoding, interleaving and deinterleaving, and frame assemble/disassemble functions. Improvements are also made in adaptive coding, frame synchronization, head compression and data compression.

A particular problem which the present invention overcomes is the inefficient use of available bandwidth. For example, ATM technology uses small size cells (53 octets), each having 5 octets that are used as a header to provide a header-error-correcting checksum and virtual path (VP) and virtual circuit (VC) ID numbers and control. The cells are assembled into frames for transmission and, using conventional synchronization techniques, would require the commitment of additional overhead bits.

Accordingly, an object of the present invention is to provided an algorithm, applicable to several cell- and packet-based protocols, that is simple and streamlined and can be implemented efficiently in software, such that specialized hardware for bit and frame synchronization pattern search is not required.

Another object is to provide an algorithm that is adaptive and loss-less, and is totally transparent to any network switches, including those specifically directed to ATM, frame relay, ISDN or SS#7 transmissions.

A further object of the present invention is to use a synchronization and acquisition algorithm that does not require any a priori knowledge of the configuration of Virtual Circuit Identifiers in use over the link, or otherwise impose any constraints on the range of Virtual Circuit Identifiers (VCIDs) or Virtual Path Identifiers (VPIDs), such as those used by the ATM switches or frame relay-type switches.

Yet another object of the present invention is to achieve bit and frame synchronization between the transmitter and the receiver over a transmission link without use of any special dedicated synchronization patterns within the data stream to perform frame acquisition and synchronization functions, without use of any bandwidth overhead and without use of any specialized hardware.

The present invention takes advantage of the fact that the transmission link, which carries cell (e.g., ATM) and packet (e.g., Spacket) traffic, has varying amounts of idle cells or packets during start-up as well as during operations.

The present invention uses the bits in the idle cells or packets to generate synchronization patterns which can be recognized by the receive software to determine frame boundaries rapidly and with a high degree of reliability.

The present invention determines frame boundaries rapidly, with just one sampling of 2I frames, where I is the interleaver depth.

Finally, the present invention provides an acquisition and synchronization technique that is very robust, such that the probability of error in synchronization is extremely small, even at very high BERs, and, if an error is made, the error can be detected within a second attempt at synchronization.

In accomplishing these objects, the present invention uses a scheme for achieving rapid bit, byte and frame synchronization between the transmitter and the receiver, without using a dedicated synchronization pattern and without randomly searching for the frame boundary. During acquisition, the transmitter fills the entire payload of the frame with a pattern that is used by the receiver to determine the location of the frame boundary. This procedure is deterministic and in most cases, a single sampling of 2I frames allows the receiver to adjust the frame boundary to the correct value.

As to synchronization, the unique content of the cell or packet framing and a novel algorithm that takes advantage of the fact that the satellite/wireless link carries varying amounts of idle cells during startup and normal operation. The algorithm uses these idle bits to generate synchronization patterns which can be recognized-rapidly and with high reliability in determination of frame boundaries. This procedure requires no overhead bits in the data stream, which results in a small savings in bandwidth.

Specifically, with respect to an ATM transmission system, the ALA transmit bit stream consist of a sequential train of interleaved frames, forming an "interleaver frame" of fixed size that is n octets long and has I frames. Each frame includes a frame header (2 octets), payload (fixed cells and variable packets) and error correcting check bits (2t octets), and the size of the packets and check bits can vary inversely to maintain a fixed frame size. The frame header includes a frame number that is incremented modulo 8 and assigned to each frame. Also included are count, size and coding information.

The invention uses (1) the frame sequence number field in the header of every frame and (2) the Reed-Solomon decoding result as a method to verify and maintain frame synchronization. Specifically, if proper frame synchronization has been achieved at the receiver, all (most) frames should have the correct incrementing frame sequence number and the Read-Solomon decoder should declare success in correcting all (most) frames. Thus, once synchronization has been achieved, received frames are monitored for correctness (absence of Reed-Solomon decoder errors and matching frame-number and correct header fields).

These and similar considerations apply to the use of the present invention in a to frame relay, ISDN or SS#7-type system, where fast and efficient acquisition and synchronization is desired.

As used herein, the term "cell" shall be used to mean a fixed size container, such as the ATM cell, and the term "packet" shall be used to mean and a variable size container, and the term "cell/packet" shall mean generically either or both such container arrangements.

BRIEF DESCRIPTION OF THE DRAWINGS

These and other features, aspects and advantages of the present invention will become better understood with reference to the following description, appended claims, and accompanying drawings, in which:

DETAILED DESCRIPTION OF THE PREFERRED EMBODIMENTS

Figure 1A:
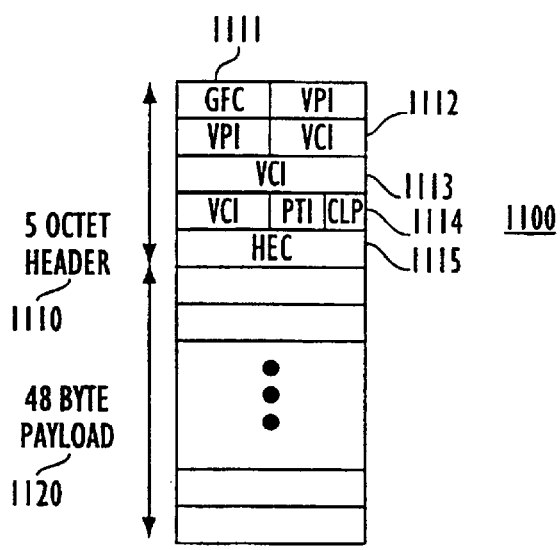
FIGS. 1A and 1B show an ATM cell structure having the UNI and NNI header formats, respectively.

In a preferred embodiment as disclosed herein, the subject matter of the present invention is embodied in one aspect of an ATM-based technology that is incorporated into an interface between conventional ATM-based technology and a wireless communication network. The interface facilitates the transmission of ATM-based traffic in a wireless communication network. However, the interface may also facilitate the transmission of ATM-based traffic over a terrestrial based network. Such interface is referred to as an ATM Link Accelerator (ALA). However, one of ordinary skill in the related art would recognize that similar structures would be applicable to frame relay and ISDN/SS7 transmission systems.

The preferred embodiment of the present invention is related to an ATM Link Accelerator (ALA) design that offers a way to interconnect ATM switches over satellites and wireless links, provide high quality of service for ATM applications, and offer efficient use of transmission link bandwidth. The ALA is particularly suited for use over both satellite and wireless terrestrial wireless links, operating at fractional T1 to several 10's of Mbit/s data rates. The ALA utilizes a method to interconnect standard ATM switches with interfaces, such as DS3 and E3, to commercial satellite and wireless-modems that support variable rates using an RS-449 programmable rate interface.

As disclosed in the Provisional Application from which priority is claimed, the ALA includes forward error correction and interleaving so that ATM applications experience fiber-like quality over satellite and wireless links, whose bit error characteristics are much poorer than those of fiber. The ALA includes a number of features, including but not limited to, a unique frame formatting technique that facilitates transmission of fixed sized and variable sized cells and packets, adaptive coding, header compression, and data compression to maximize user throughput over expensive satellite and wireless links.

The present invention specifically concerns a novel scheme, which may be incorporated in the ALA-acquisition and synchronization algorithm (ASA) or other comparable algorithm, for achieving bit and frame synchronization between the transmitter and the receiver over a transmission link. The scheme is different from the traditional approach that uses special dedicated synchronization patterns within the data stream to perform frame acquisition and synchronization functions, resulting in a small bandwidth overhead and requiring specialized hardware. The ALA-ASA requires no overhead pattern bits, and can be implemented with simple hardware and software. The ALA-ASA takes advantage of the fact that the transmission link carries asynchronous ATM and packet traffic, which results in the link carrying varying amounts of idle cells or packets, more during a start-up phase, fewer during a normal data transfer phase. The ALA-ASA uses these idle bits to generate synchronization patterns which can be recognized by the receiver software to determine frame boundaries. With this technique, frame boundaries can be recognized very rapidly with high degree of reliability. Specifically, frame boundaries can be determined with just one sampling of 2I frames, where I is the interleaver depth. The acquisition time is much smaller than that achieved by traditional techniques, an advantage that is especially critical for low speed links.

Figure 2A:
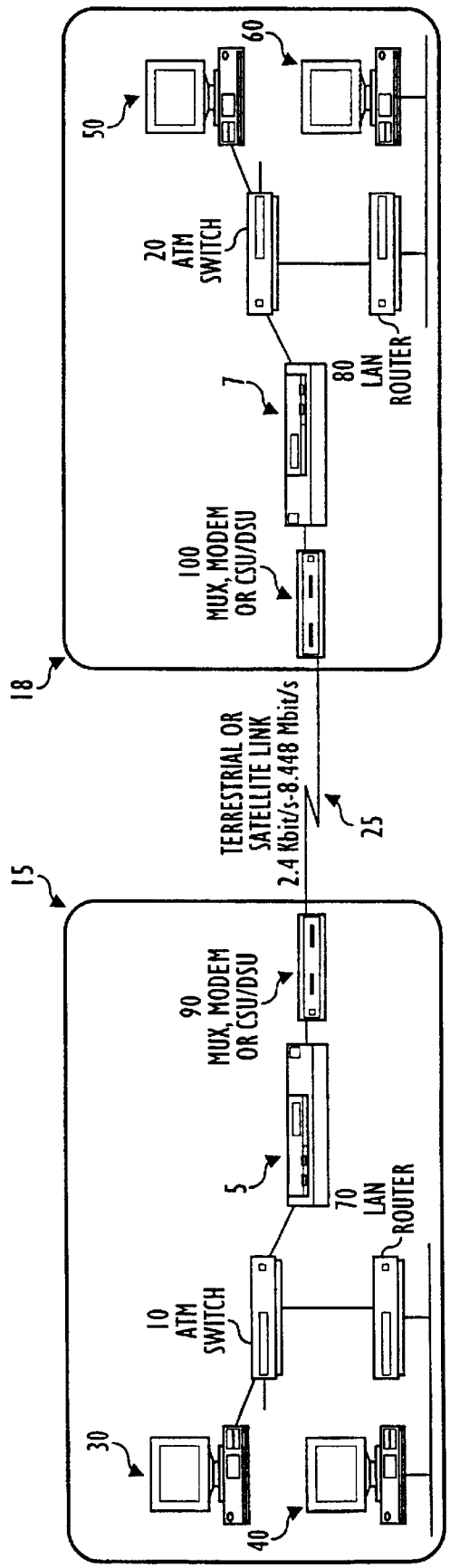
FIG. 2A shows a wireless/satellite system architecture, with an interface at each of a receiving and transmitting station, which implements the present invention.

FIG. 2A depicts a communication system involving two local area networks (LAN) 15 and 18 that are connected by a terrestrial wireless or satellite link 25 that, in a preferred embodiment but without limitation, operates in the range of 2.4 Kb/s to 8.448Mb/s. Each network has a respective interface 5, 7 which provides a means of interconnecting a standard ATM switch 10 and 20 in each LAN over the terrestrial wireless or satellite link 25. The interfaces are operative to provide high quality service for ATM-based applications and to provide an efficient use of transmission link bandwidth. In the illustrated application, the ATM switches 10 and 20 are connected to respective groups of computers (e.g., 30, 40 and 50, 60) directly or through LAN routers 70 and 80. The interfaces 5, 7 may connect to the terrestrial wireless or satellite link 25 via respective modems 90, 100, which implement a RS-449 programmable rate interface. Alternatively, a multiplexer, a channel service unit (CSU) or a digital service unit (DSU) may be used instead of a modem.

The architecture and operation of an ALA apparatus 1000 that embodies the present invention is discussed in connection with FIG. 2B. User ATM cells having a conventional 53-octet structure, including a 5-octet header and a 48-octet payload, are received by the ATM cell interface block 1001 from an RS-448, T1, E1, DS3 or E3 link. In the interface block 1001, the HEC byte in the headers of the received ATM cells is discarded. The processed ATM cells are then forwarded to an ATM physical layer protocol processor 1002. The ATM physical layer protocol processor 1002 handles receive cell synchronization and ATM HEC processing functions; it also filters and discards idle cells.

Next, the series of processed ATM cells are further compressed, as individual cells or packets. For this purpose, the original ATM cells (without the HEC byte in the header) are directed by a router 1003 to either the header compression function 1004 or the data compression function 1010. The router 1003 selects the destination function on the basis of the content of the ATM cells and operator-selected options. The header compression function 1004 replaces the 4-octet ATM header with a 2-octet value, in a manner disclosed in the Provisional Application from which priority is claimed. The header compression function can be disabled. The data compression function 1010 takes up to 4 cells and compresses them into a single variable-sized packet. In a preferred embodiment of the ALA, users can configure the ALA so that cells for certain configured VCs are routed through the data compression function 1010.

Subsequently, the cells with compressed headers and the packets containing compressed cells are added to output priority queues 1005. Cells are entered into a high- or low priority queue, depending on VC identification and user configuration options, in preparation for assembly into frames for transmission. For example, packets containing compressed cells may be entered into the lowest-priority queue, while individual cells with compressed headers may be placed into the highest priority queue for assembly into frames.

Frame assembly 1006 receives the output of the prioritized queues and, every "frame" time, creates a fixed-sized frame that contains a frame header and data from cells or packets. Some cells and packets may be split across frames.

Once created, the frame is sent through a RS (Reed-Solomon) Encoder/Interleaver 1007. The Reed Solomon encoder function appends a number of error correction checkbytes to the frame. The frame is then processed by the interleaver function, which reorders the octets among I frames before parallel to serial conversion in P-S converter 1008 and transmission over the WAN via RS-1449 WAN line interface 1009, where currently the preferred embodiment uses $I \leq 8$. The interleaving operation occurs under the control of an adaptive coding management microprocessor 1019 which uses an interleaving RAM (not shown) to combine several frames.

Each ALA 1000 also is provided with components which are employed for the disassembly of transmitted frames. In particular, the WAN interface 1009 that is used with the present invention receives the transmitted data stream and provides the series of bits to a serial to parallel converter 1011. Thus, frames over the WAN link are received at the WAN interface and collected into fixed size frames. The parallel signal is then provided to a RS Decoder/Deinterleaver, which has functions that first are used to deinterleaver an interleaved frame. The deinterleaving operation also occurs under the control of an adaptive coding management microprocessor 1019, using a deinterleaver RAM. Once an interleaved frame has been deinterleaved to provide individual frames, each individual frame is processed by a Reed-Solomon decoder function, which removes the Reed-Solomon check-bytes and corrects any bit errors of the frame.

Subsequently, each of the corrected frames are output from the Reed-Solomon decoder function in RS Decode/Deinterleaver 1012 to a disassembler function 1013, which uses a RAM buffer to store the frames for processing. The microprocessor 1019, which is also employed as a frame disassembler in the ALA of the present invention, disassembles each corrected frame output by the Reed-Solomon Decoder and separates the data payload of each frame into its individual components (e.g. ATM cells and/or packets) in accordance with information provided in the header of the frame. The ATM cells and/or packets are then output via an input queue 1014, comprising a buffer RAM, to the ATM cell microprocessor 1019, which appends error correction information to the header of each ATM cell and separates compressed cells. Specifically, the error-free frame is then disassembled and cells and packets containing compressed cells are extracted. Cells and packets are arranged into two separate input queues in input queue 1014. In one queue, cells from the cell input queue are sent through the header decompression function (unless that function is disabled by the user). Packets from the packet queue are sent through the data decompression function.

In discharging the header decompression function, the ATM cell processor 1019 also will apply an ALA-AHCA decompression algorithm within header decompression function 1016, which substitutes 4 octets of the header for the received 2-octet code. The ATM cell processor 1019 also will control a data decompression function for received packets. The ATM cell microprocessor 1019 then outputs the ATM cell (with a decompressed error correction portion) and/or packet to a cell transmission function 1017. The individual ATM cells from the transmission function 1017 are processed by the ATM physical layer protocol processor 1002 so that the HEC byte can be added to the header and a standard ATM cell with 53 octets created. The ATM physical layer protocol processor 1002 also generates idle cells as needed. The protocol processor 1002 outputs the standard cells to the terrestrial line interface 1001 for return of the ATM cells to the ATM switch for routing.

As seen in. FIG. 2B, the ALA also includes a capability for providing statistics, using function 1021, and adaptive system configuration, using function 1022. A further function, which is the subject of the present invention is the frame acquisition and synchronization function 1020, which is provided as an application of the microprocessor used in the ALA. The acquisition and synchronization function is detailed subsequently, following a discussion of the frame formats to which the function is applied.

According to the present invention, in an ATM environment, ATM based cells are organized into frames which are suitable for wireless communications. Advantageously, the header and data portions of each cell may be separated and compressed so as to increase the effective bandwidth of the wireless communication link. Each frame can be efficiently packed with ATM cells and/or variable size packets which may be made up of compressed ATM cells. In addition, as required, only a portion of an ATM cell or variable size packet may be included in a frame, in order to provide optimal efficiency.

Figure 1B:
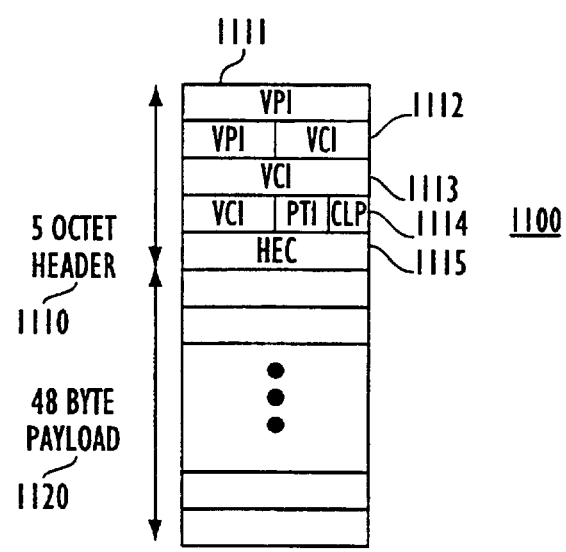
Figure 3:
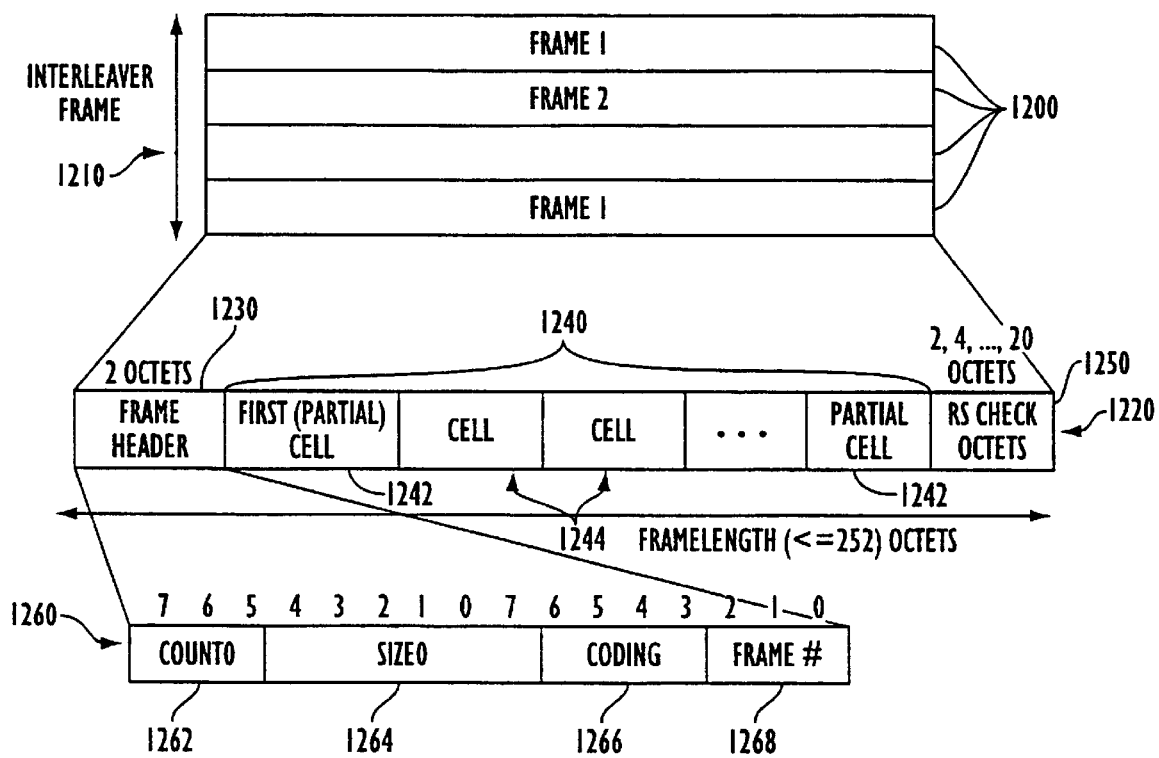
FIG. 3 shows an example of a frame formed for transmission of ATM cells and packets in accordance with the present invention.

The standard ATM cell formats that are relevant to the implementation of the present invention are illustrated in FIGS. 1A and 1B, and the standard frame format is illustrated in FIG. 3. With respect to the standard ATM cell format as seen in FIGS. 1A and 1B (which is preferred), the cell 1100 includes a header 1110, comprising five octets 1111–1115, and a payload 1120 comprising 48 octets 1121–1123. The five octets in the header include an HEC checksum, two virtual path identifiers (VPID) and two virtual circuit identifiers (VCID). In a conventional processing of a plurality of cells from an ATM switch, as previously noted, the headers are stripped from the cells and compressed, and the remaining data (without headers) for the plurality of cells is also compressed. The separated and compressed header and data components are provided into a frame format for transmission.

The ALA uses a unique frame structure over the WAN link. This frame structure has been designed to facilitate fast frame synchronization, accommodation of fixed-size ATM cells as well as variable-size packets, fast recovery from lost frames, very low bandwidth overhead as well as dynamic Reed-Solomon coding change without introducing data loss during the coding rate change transition. FIG. 3 shows the ALA frame format.

Each frame 1200 shown in FIG. 3 corresponds to a fundamental unit of transmission over the WAN link. Each frame 1200 is a fixed size frame, which is n octets long. If interleaving is utilized, then I frames are used to compose an "interleaved frame" 1210. An interleaving technique rearranges the order of the bytes in the interleaved frame and transmits each byte sequentially over a WAN link. There are no special synchronization bits employed within the frame structure.

An exemplary frame 1220 is n bytes long and includes a frame header 1230, a data payload 1240, and a block code 1250, as shown in FIG. 3. The header 1230 is two octets long. The data payload 1240 has a variable length which depends on the size of the block code. As noted above, the data payload 1240 may contain a combination of partial or complete fixed-sized ATM cells 1242 and 1244 and variable-size packets (the packets, which are not shown, may contain one or more compressed ATM cells or some other data). The block code 1250 has a length which corresponds to a multiplicity of octets (e.g. block coding length=2t, t>0, such that 2t is an even number, as is understood by one of ordinary skill in the art. Advantageously, Reed-Solomon coding check-bytes may be provided as the block code 1250.

The above-mentioned frame header 1230 is made up of a number of fields. An exemplary frame header 1260 includes first through fourth fields 1262, 1264, 1266 and 1268. The first field 1262 contains the variable COUNT which defines the number of complete ATM cells in a frame, including any partial ATM cell which follows the complete ATM cells. It does not include a first partial cell or packet, if any, that may appear at the beginning of a frame. The second field 1264 contains the variable SIZE which defines the space within the data payload that is allocated for a first partial ATM cell to be contained therein. By way of example, the variable SIZE may be set equal to the number of octets reserved for the first partial ATM cell divided by four.

A third field 1266 contains the variable FRAME# which defines the frame number. Frame numbers may range from 0–7 and repeat periodically.

Finally, a fourth field 1268 contains a variable CODING which defines aspects of the corresponding block code 1250 based on the frame number. By way of example, if the value of FRAME# is equal to zero, then the fourth field 1268 (or coding field) represents a suggested value of the number of octets which are to be reserved for the block code 1250. Advantageously, the block code 1250 may be generated in accordance with Reed-Solomon Coding. If Reed-Solomon Coding is employed then the coding field 1268 represents a suggested value of the number of Reed-Solomon octets divided by two so that the transmitting interface should employ for its own transmissions. Reed-Solomon Coding is implemented in the form of check-bytes which are generated by a standard Reed-Solomon algorithm based on the size of the frame (expressed as "N" bytes) and the number of check-bytes (2t) to be included within the corresponding frame.

If the receiving interface is not yet synchronized to its receiving bit stream, the coding field 1268 is set to a predetermined value (e.g. 0×F). The coding field 1268 cannot assume a value of zero, which corresponds to an invalid value.

If the value of FRAME# is equal to 1, then the least significant bit of the coding field 1268 is set to 1 to represent the fact that an ATM cell header compression algorithm has been activated. If the value of FRAME# is equal to 2 or 3, then the coding field 1269 may be set to zero;

If the value of FRAME# is greater than 3, then the coding field 1268 is set to a number which is a function of the number of block coding octets that the transmitting interface should use for its own transmissions starting with the next frame numbered zero.

The rules for filling each frame's data payload with ATM cells and packets would be understood from the foregoing description by one of ordinary skill in the are and, in any event, are described in the Provisional Application, from which priority is claimed.

After the complete ATM cells are included in the data payload, a number of variable-size packets may be provided therein. Each packet contains a length field which is 1-octet in length followed by the packet's contents. The value contained in the length field includes the length of the length field itself. For example, a packet having a length of 61 octets will begin with a length field of 62. If the last packet cannot be entirely contained in the data payload, then only its initial portion will be included therein. According to the present invention, the length field of a partial packet specifies the length of the entire packet.

If there are any octets left over in the data payload, then the first such unused octet shall contain a zero. The remainder of the octets, if any, shall be filled sequentially with the numbers i, i+1, i+2, . . . , where i is the octet number of the first such octet in the payload (octets in the payload are implicitly numbered 0,1, . . . ).

Based on the above mentioned rules, it is possible for the data payload of a frame to contain ATM cells only, packets only, or a combination of both. In addition, an ATM cell or packet may be split across more than two frames if either is larger than the size of the data payload. Moreover, the data payload size is unrelated to the size of an ATM cell or variable size packet. By way of example, the size of the data payload can be as small as two bytes.

The above-described frame structure allows for the possibility of dynamically changing the Reed-Solomon code size by correspondingly changing the data payload size but keeping the frame size constant. Such a scheme enhances the efficient use of the available transmission bandwidth.

Advantageously, if a receiving interface "loses" a frame, due to, for example, excessive bit errors in the frame, the variable SIZE can be used to rapidly determine an ATM cell or packet boundary in the very next frame.

Figure 2B:
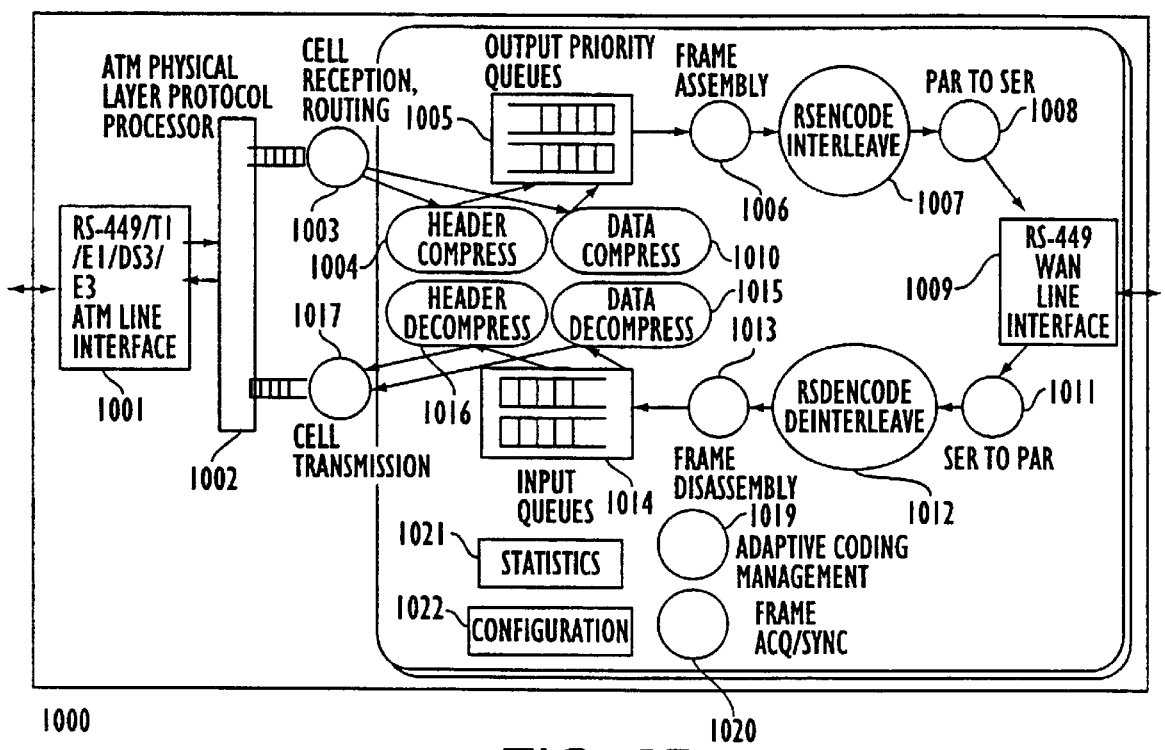
FIG. 2B shows a schematic diagram of an ATM interface corresponding to the present invention.

With reference again to the ALA illustrated in FIG. 2B, particularly the frame acquisition/synchronization application 1020, the underlying algorithm is effective to synchronize bit and frame timing between the transmitter and the receiver of the ALA bit stream. As previously noted, the ALA transmits a bit stream consisting of a sequential train of interleaved frames; each frame includes a frame header, a frame payload and the error correcting Reed-Solomon check bytes. The frame header includes a frame number, that is incremented modulo 8 and assigned to each frame. Unlike other systems, the ALA frame, format does not include any special bits devoted to the frame synchronization function. The ALA-ASA uses the frame sequence number field in the header of every frame and the Reed-Solomon decoding result as a method to verify and maintain frame synchronization. If proper frame synchronization has been achieved at the receiver, then most (possibly all) frames should have the correct incrementing frame sequence number and the Reed-Solomon decoder should declare success in correcting most (possibly all) frames.

In principle, ALA-ASA could work by randomly or systematically shifting the receive frame boundary, and by checking whether frames are being correctly received, until the correct boundary is reached. However, the ALA-ASA uses a technique to achieve acquisition and frame synchronization that does not require a random search for the frame boundary.

Figure 4A:
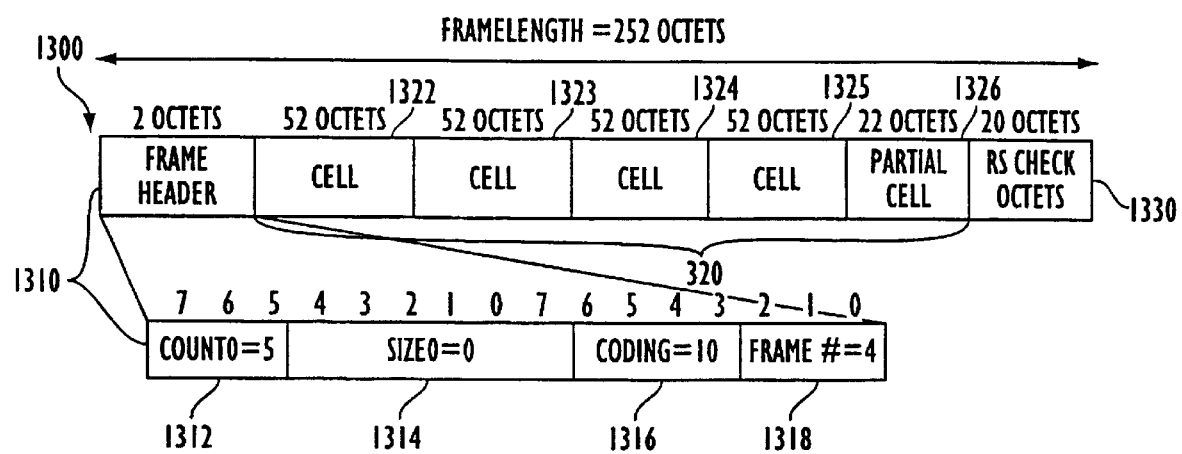
FIGS. 4A–4C show examples of frames formed in accordance with the present invention.
Figure 4B:
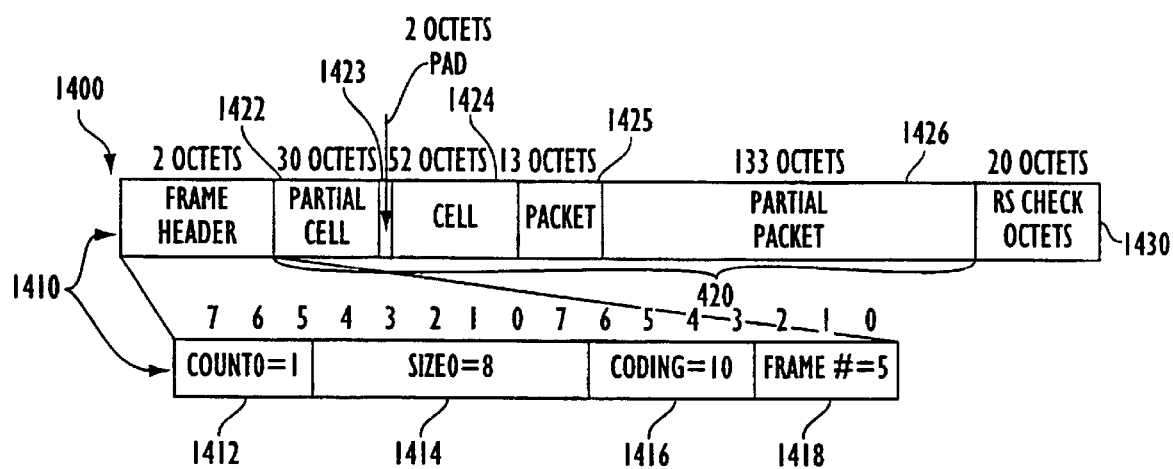
Figure 4C:
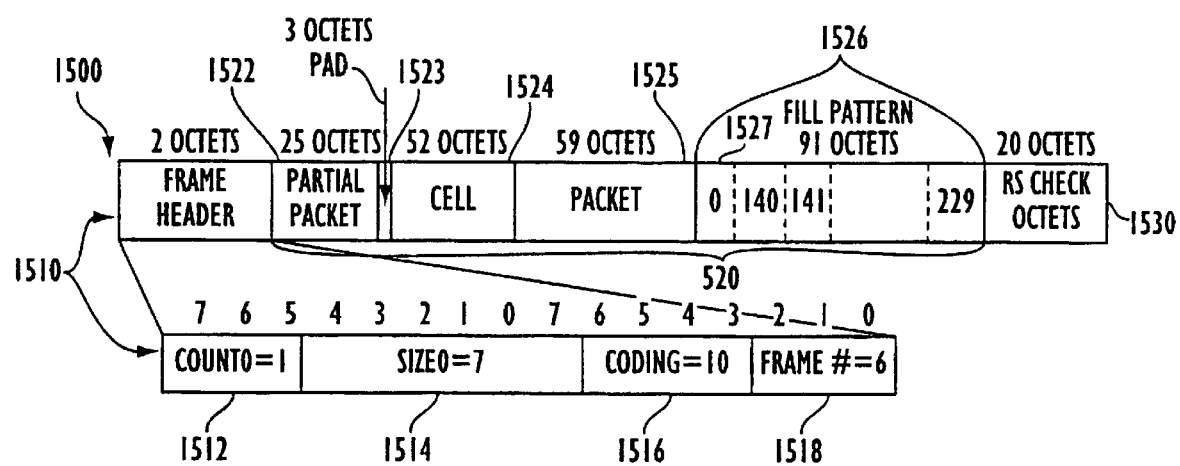

Specifically, in every frame, following the header, the payload portion of the frame will contain all ATM cells, ATM cells and a partial cell (see FIG. 4A), ATM cells, partial cells, packets and partial packets (see FIG. 4B) and where there is space remaining in a frame, a fill pattern that is a sequence of numbers, as subsequently explained in the framing Rules 1–4, and as seen in FIG. 4C. During acquisition, the transmitter fills the entire payload of the frame with a fill pattern, comprising a sequence of numbers beginning with "0". No data is transmitted in the payload. At the receiver, the sequence is detected for purposes of acquisition, and may also be used to determine where the frame boundary is located for purposes of synchronization. This procedure is deterministic and in most cases, a single sampling of 2I frames, where I is the interleaver depth, allows the receiver to adjust the frame boundary to the correct value.

Before explaining the frame synchronization technique of the present invention, it should be recalled that the fundamental unit of transmission over the WAN link is a fixed size frame, which is n octets long. If an interleaving depth of I is used, then I such frames are used to compose an "interleaver frame". The interleaver rearranges the order of the bytes in the interleaver frame and transmits each byte sequentially over the WAN link.

It should be noted that there are no special synchronization bits in the frame structure illustrated in FIG. 3. Each frame is n bytes long and consists of:

a 2-octet header followed by the frame payload, and terminated by 2t octets (t>0) of Reed-Solomon coding checkbytes in the end.

The payload contains a combination of fixed-sized ATM cells and variable-size packets (the packets may contain one or more compressed cells).

In accordance with the present invention, the rules for filling a frame payload with cells and packets are as follows:

1. If the previously transmitted frame contained a partial cell or packet at the end of the payload, the frame payload currently being transmitted begins with the next portion of that cell or packet. This portion shall consume min(4*SIZE, payload size) octets of the payload, where SIZE≧0. The actual size of this partial cell or packet may be up to three octets less than 4*SIZE, in which case the extra octets shall be filled with zeroes.

2. After the initial partial cell or packet segment, the payload contains COUNT fixed-size cells, COUNT≧0. If the last cell cannot be entirely contained in the payload, then only its initial portion is included in the payload.

3. After the fixed-size cells in the payload, the payload contains a number of variable-size packets. Each packet contains a 1-octet length (# of octets in the packet) field followed by the packet contents. If the last packet cannot be entirely contained in the payload, then only its initial portion is included in the payload.

4. If there are any octets left over in the payload, then the first such unused octet shall contain a zero. The rest of the octets, if any, shall be filled sequentially with the numbers i, i+1, i+2, . . . , where i is the octet number of the first such octet in the payload (octets in the payload are implicitly numbered 0, 1, . . . ).

From these rules, one can see that a frame payload may contain cells only, packets only, or a combination of both. A frame with no cells or packets contains the sequence 0, 1, 2, . . . in the payload. A cell or packet may be split across more than two frames if either is larger than the payload field. It should be noted that the payload size is unrelated to a cell or packet size; the payload size can be as small as two bytes. This frame structure design allows the possibility of dynamically changing the Reed-Solomon code size by correspondingly changing the payload size but keeping the frame size constant.

If the receiver "loses" a frame, for example, due to excessive bit errors in the frame, the SIZE field allows rapid determination of the cell or packet boundary on the very next frame.

FIGS. 4A–4C show examples of frames which are organized according to the frame format of the present invention. Each frame has a fixed length of 252 octets. In addition, the contents of each frame is also shown in FIGS. 4A–4C. Although ATM cells contain 53 octets, as noted above, FIGS. 4A–4C show each cell containing only 52 octets. The reason for this discrepancy stems from the fact that when a cell is received by an interface, one octet of the 5 octet header associated with that cell is removed to detect errors within the header. The removal of the octet occurs prior to the assembling of each frame of a communication signal. In addition, each packet includes a packet length field in their first octet which is not shown in FIGS. 4A–4C, as discussed above.

FIG. 4A shows a frame 1300 formed in accordance with the present invention which includes a frame header 1310, a data payload 1320 and a block code 1330. The frame header 1310 includes a first field 1312 which contains a variable COUNT having a value of 5, and a second field 1314 which contains a variable SIZE having a value of 0. The frame header 1310 also includes a third field 1316 which contains a variable CODING having a value of 10, and a fourth field 1318 which contains a variable FRAME# having a value of 4.

Given that the value of the variable COUNT is 5, there are 5 ATM cells 1322–1326 included within the data payload 1320. Because the value of the variable SIZE is 0, the data payload 1320 does not contain a partial ATM cell which precedes the 5 ATM cells 1322–1325 included therein. Accordingly, there are at least 4 complete ATM cells contained in the data payload 1320. In addition, because the frame header 131 0 occupies 2 octets and the block code 1330 occupies 20 octets, as determined by the value of the variable CODING, (which in this case is 10) it is clear that a partial ATM cell 1326 must also be included in the data payload 1320.

The reason for this sterns from the fact that there are 22 octets used for the frame header 1310 and the block code 1330, alone leaving 230 octets for the data payload 1320. With four complete ATM cells 1322–1325 occupying the data payload 1320, at 52 octets apiece, only 22 octets are left in the data payload 1320 for the remaining ATM cell. Therefore, only a partial ATM cell 1326 can be included in the current frame 1300. The remaining 30 octets must be included in the next frame, as shown in FIG. 4B.

FIG. 4B shows a frame 1400 formed in accordance with the present invention which includes a frame header 1410, a data payload 1420 and a block code 1430. The frame header 1410 includes a first field 1412 which contains a variable COUNT having a value of 1, and a second field 1414 which contains a variable SIZE having a value of 8. The frame header 1410 also includes a third field 1416 which contains a variable CODING having a value of 10, and a fourth field 1418 which contains a variable FRAME# having a value of 5.

Because the variable SIZE has a value of 8, there are 32 octets which have been reserved for the initial partial cell 1422 in the data payload 1420. As the initial partial cell 1422 only requires 30 octets, 2 additional octets of padding 1423 are included in the data payload 1420. With 22 octets being used for the frame header 1410 and the block code 1430 and 32 octets being used for the initial partial ATM cell, there are still 198 octets remaining in the data payload 1420 of the frame 1400. As the value of COUNT is 1, there is at least one complete ATM cell 1424 included in the data payload 1420 of the frame 1400.

The remaining 198 octets of the data payload 1420 are occupied by a complete packet 1425 and a partial packet 1426. The complete packet 1425 occupies 13 octets of the data payload, while the partial packet 1426 occupies the remaining 133 octets of the fifth frame's data payload. The next frame shown in FIG. 4C, includes the remainder of the second packet which includes the partial packet 1426.

FIG. 4C shows a frame 1500 formed in accordance with the present invention which includes a frame header 1.510, a data payload 1520 and a block code 1530. The frame header 1510 includes a first field 1512 which contains a variable COUNT having a value of 1, and a second field 1514 which contains a variable SIZE having a value of 7. The frame header 1510 also includes a third field 1516 which contains a variable CODING having a value of 10, and a fourth field 1518 which contains a variable FRAME# having a value of 6.

As the value of SIZE is 7, there are 28 octets reserved for a partial packet 1522 which along with the partial packet 1426 (shown in FIG. 4B) comprises the second packet shown in FIG. 4B. However, because the partial packet 1522 only occupies 25 octets, three octets of padding 1523 are included in the data payload 1520 of the sixth frame. Because the value of COUNT is one, there is an ATM cell 1524 included in the sixth frame. This ATM cell 1524 is also a complete ATM cell because only 50 octets of the frame 500 are employed for the frame header 1510, block code 1530 and the remainder of the second packet.

There is one 59 octet packet 1525 which also occupies the data payload 1520 of the sixth frame, leaving 91 octets remaining. According to the present invention the remaining 91 octets are used for the synchronization pattern 1526 described above. However, the first octet 1527 of the left over portion of the data payload 1520 has a value of zero to delineate between the end of the packet and the beginning of the synchronization pattern 1526. Each byte position of the remainder of the left over portion of the data payload 1520 stores a number which corresponds to the byte position.

As shown in FIG. 4C, the first byte position of the synchronization pattern, which corresponds to the one hundred and fortieth byte position of the data payload, stores a value of zero. The second byte position of the synchronization pattern, which corresponds to the one hundred and forty first byte position of the data payload, stores a value of 140. The third byte position of the synchronization pattern, which corresponds to the one hundred and forty second byte position of the data payload, stores a value of 141. The value stored in each subsequent byte position of the data payload increases sequentially up to and including the last or two hundred and thirtieth byte position of the data payload. Therefore, the two hundred and thirtieth byte position of the data payload would store a value of 229.

As noted above, if there are no partial or complete ATM cells or packets included in a particular cell, then the data payload can be filled entirely with the synchronization pattern. The advantage of using the synchronization pattern of the present invention stems from the fact that it is very easy to determine where the boundary of a particular frame lies for frame synchronization once the value stored at a particular byte position is ascertained.

In implementing the ALA-ASA algorithm, the following parameters would be used:

| Parameters: | |
|---|---|
| n | length of ALA frame in octets |
| N | length of ALA frame in bits; = n * 8 |
| I | Interleaver depth, I = 1, 2, . . . 8 |

Figure 5A:
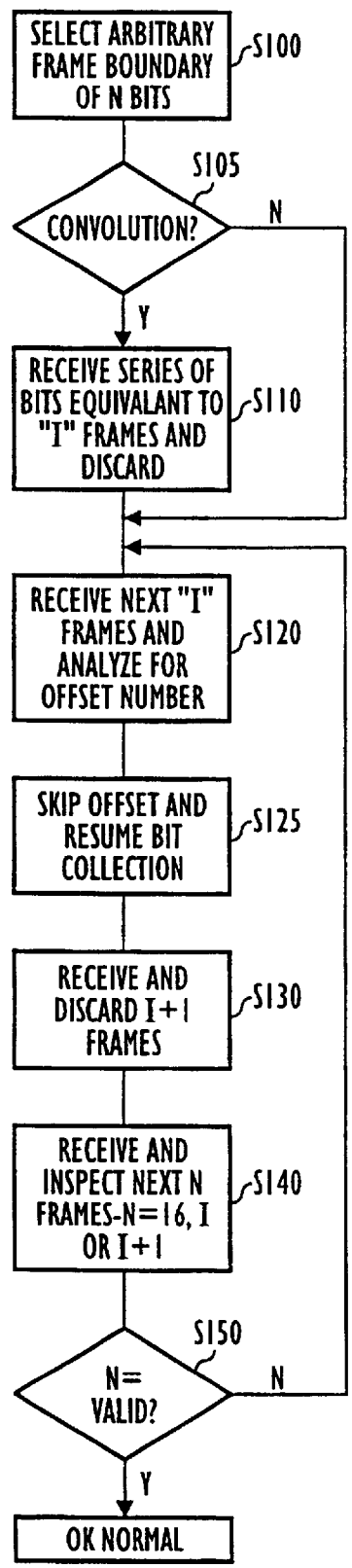
FIG. 5A illustrates a flow chart for implementing an algorithm for achieving frame synchronization in accordance with the present invention.

The frame synchronization algorithm is illustrated in flow-chart form in FIG. 5A. The algorithm is executed by the receiver initially choosing an arbitrary receive frame boundary in step S-100. In this step, N sequential bits from the receiver are collected and designated as a "frame". With reference to FIG. 2, the receive bit stream is sent through the deinterleaver and Reed-Solomon decoder 1012 before collection into a frame in frame disassembly 1013.

In step S110, initially, I "frames" are received and discarded. This "flush" operation is done to initialize the deinterleaver, if it is a "convolutional" type. On the basis of a decision at step. S105, this step can be skipped if a non-convolutional deinterleaver is used.

Then, in step S120, the next I "frames" (for a convolutional type; or the first I frames for a non-convolutional type deinterleaver) are received and analyzed. The analysis results in an "offset" number. In step S125, the receiver logic is instructed to skip "offset" bits after the next frame and then resume frame bit collection. The offset computation algorithm is described below in connection with FIG. 5B.

In step S130, the next I+1 "frames" are received and discarded.

In step S140, the next 16 "frames" are received and inspected for validity. The value I or I+1 can be used instead of 16, but the value 16 reduces the probability of a false acquisition.

Finally, if all 16 (or other selected quantity) frames are valid, then synchronization is achieved and normal operation commences. If any of the 16 frames is found invalid, then this step is terminated immediately and Steps S120 through S140 are repeated.

A frame is considered valid if it is received without errors (all frame header fields contain valid values) and the sequence number field in the header of frames 2 through 16 is one more than the sequence number field in the header of the corresponding previous frame. The Reed-Solomon decoder status is ignored at this stage.

In step S150, once receive synchronization has been achieved, the ALA monitors received frames for correctness (no Reed-Solomon decoder errors, frame number matches expected frame number, all header fields are correct). If in any 1-second period the receiver does not detect a sequence of 16 correct consecutive frames, then the receiver is declared out of synchronization and Step S120 is entered.

Figure 5B:
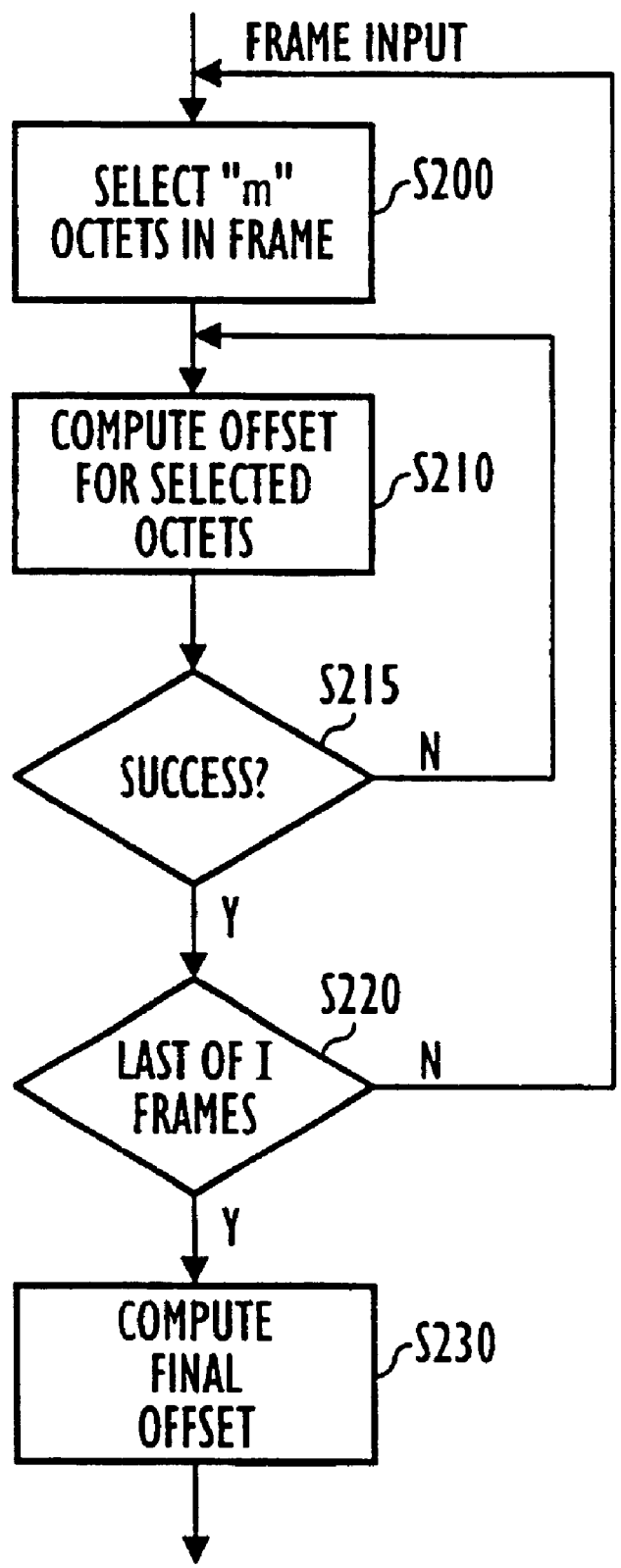
FIG. 5B illustrates a flow chart for calculating an "offset" value for incoming frames in connection with the synchronization algorithm of FIG. 5A.

For each of I frames in Step S120 above, the following analysis is done to compute a frame offset, with reference to the flow chart in FIG. 5B.

In step S200, "m" octets are selected in the frame for analysis. Preferably, m=3 and these three octets could be randomly selected or the octets can be at predefined offsets in the frame. Let the index of these three octets in the frame payload be i1, i2 and i3. (Note that instead of three, any number can be used).

In step S210, for each of the selected octets in turn, the frame offset number is computed. The computation is conducted as follows:

```
Given octet index, i, compute
    diff1 = payload[i+1] – payload[i]
    diff2 = payload[i+2] – payload[i+1]
    if diff1 == 1 and diff2 == 1 then
        offset = (payload[i] – i ) * 8 * I
    else
        clear lowest bit of diff1 and diff2
        if diff1 != diff2 or diff1 == 0 or diff1 is not a power of 2
        then
            return failure
        endif
        determine b such that diff1 = 2 ** b
        if payload[i + 1] & diff1 == 0 then
            i = i + 1
        endif
        offset = ((((payload[i] << 8) | payload[i+1]) >> b) – i – 1)*
        8 * I + b
    endif
    if offset >N * I / 2 then
        offset = offset –N * I
    else if offset < –N* I / 2 then
        offset = offset +N * I
    endif
```

A determination is made as to whether the computation is successful in step S215, and the offset computation step terminates on the first successful computation.

In step S220, all incoming frames are analyzed in the same manner until I frames have been received.

In step S230, when all I frames have been analyzed, the final offset value is computed as follows:

```
If the offset computation succeeded for all the I frames, then
    offset = (sum of all I offsets) / I
else
    offset = random_number () % N
    offset = 1 can be used as an alternative
endif.
```

On the basis of the foregoing description of the synchronization algorithm, the present invention achieves rapid synchronization without the use of any overhead bits, and simply by using the predetermined content of the standard frames for transmission of ATM cells and packets.

Figure 6A:
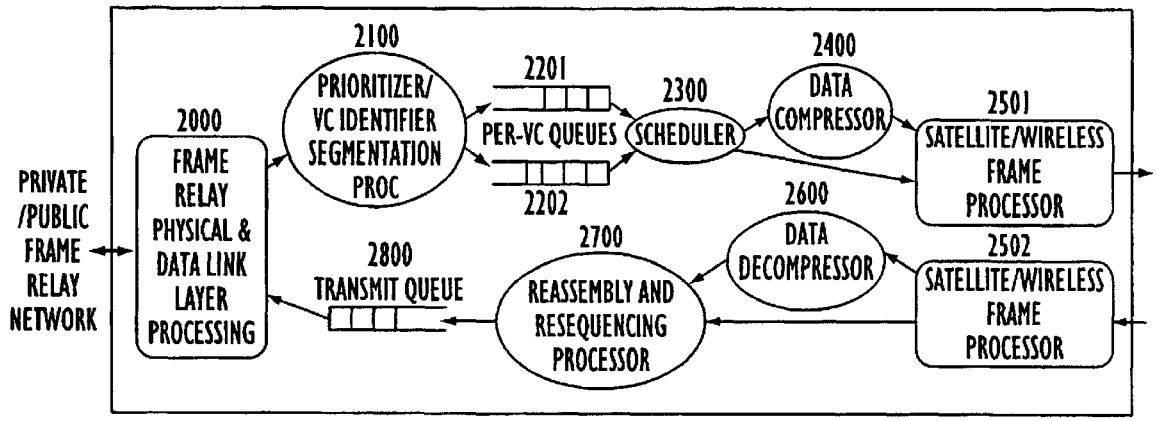
FIG. 6A illustrates a high level arrangement for a frame relay system.

FIG. 6A is a high level description of a frame relay system that performs frame relay processing to efficiently carry frame relay packets over wireless/satellite links. This system can perform the following:

Frame Relay processing at the Physical Layer and the Data Link Layer

Formatting of Data (variable length packets, segmentation and reassembly, resequencing)

Dynamic Forward Error Coding

Interleaving of frames (to spread the effect of burst errors)

Per VC data compression

Prioritization and Scheduling

Header Compression

In the high level description of the various functions performed in the system. seen in FIG. 6A, to the left of the diagram is the private/public frame relay network and to the right is the satellite/wireless link.

The illustrated system uses a robust, flexible frame format between the 2 communicating terminals which allows the transport of several variable sized Spackets (segmented packets) in a frame and also to carry a single Spacket over several frames, whichever the case might be. Also, the frame format allows fast synchronization and the exchange of coding information. Each frame contains Reed-Solomon check bytes that are used for error correction and to enhance the quality of the satellite/wireless link. The number of RS check bytes in a frame can be changed on the fly, without any loss of data, to compensate for varying link conditions. The decision to change the RS check bytes in a frame is based on the constant monitoring of the link quality. Several frames are also interleaved before transmission over the satellite/wireless link, to help spread the effect of burst errors over several frames, all of which can then be corrected by the FEC in the frames. Also, Virtual Channels (VCs) can be configured to be enabled for data compression, which means that the Spackets belonging to the VC are to be passed through a data compressor/decompressor combination to save bandwidth. VCs can also be configured to be either high or low priority VCs and the scheduler then, uses this information to fairly transmit the various Spackets over the satellite/wireless link.

In operation, a private or public frame relay network provides the frame relay packets to the frame relay physical and data link layer processing block 2000, where they are received and processed as specified in ITU recommendation Q.922 (Link Access Procedures for Frame Relay). The physical layer processing is similar to the processing of any HDLC data stream. This is the processing performed in most Frame Relay Access Devices (FRADs).

A frame relay packet received from the terrestrial network consists of payload data and a CRC field, and flags at the beginning and the end of the frame. The frame relay processing removes the flags and the CRC fields and transports only the payload section of the frame relay packet over the satellite link. The CRC and the flag information is regenerated at the receiving terminal and added to the packet before it is transmitted to the receive side terrestrial network.

Figure 6B:
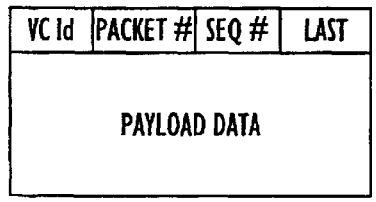
FIG. 6B illustrates the fields in a Spacket used in a frame relay system.

In prioritizer/VC identifier/Segmentation processor 2100, the variable length frame relay packets are segmented into several smaller packets called Spackets. The Spackets allow efficient scheduling of packets belonging to multiple priorities and lossless data compression. FIG. 6B illustrates the various fields in a Spacket, whose content provides for efficient processing of the Spackets, as subsequently described.

In order to avoid an intolerable delay of high priority packets (e.g., audio and video) due to processing and transmission of low priority packets, Spackets belonging to a high priority packet could be transferred after a single Spacket from a low priority packet has been transferred, thus minimizing the delay variance that the high priority packet experiences. This technique minimizes the delay variance significantly and the satellite/wireless network performance is better than terrestrial networks, as far as delay variance is concerned. Thus, when each frame relay packet is segmented into one or more Spackets, all but the last Spacket are n bytes long. The last Spacket could also be n bytes long if the frame relay packet, to begin with, was of a length which was an integral multiple of n. A Spacket is then prepended with a header as shown in FIG. 6B that contains a Virtual Channel (VC) Identifier for the channel to which the packet belongs. Also, the header is supplied with the packet and the sequence numbers. The packet number increments for each new frame relay packet. The sequence number increments for each Spacket within the frame relay packet. Information about the priority of the packets and whether or not the packets are compressed is maintained locally. All this information is used to perform segmentation/reassembly, data compression/decompression, prioritization and scheduling. The "last field" indicates whether or not the Spacket is the last Spacket for the frame relay packet. If it is, then at the receiving terminal, the frame relay packet can be reassembled and transmitted over the terrestrial link.

The sizes of the various fields can be left to the discretion of the system designer. The VC Id field would either be the size of the entire VC field in the frame relay packet or could be the size specified in the header compression parameters. The size of the Packet number and Sequence number are also left to the system designer. The "last field" is a single bit. The size of the payload is determined by a trade-off between the overheads and the performance of the system. If the payload size is very low, the overheads will be very high, but the delay variance performance of the system will be very good. If the payload size is set to a large value, then the delay variance performance will be poorer but the overheads will be lower. Hence, the sizes would depend on the overheads the designer is prepared to allow, and the performance specifications of the system.

Next, queues of Spackets belonging to, different VCs are stored for use by the scheduler in Per-VC or priority queues 2201 and 2202. In the case of a priority queue, high priority queues 2201 and low priority queues 2201 are maintained and the cells in each priority queue are transmitted on a FIFO basis. A more preferable mode of queuing is to have a queue for each VC, which is designated to have a high or low priority, and then store the cells belonging to each VC in its corresponding queue. Cells in these per-VC queues are also transmitted on a FIFO basis to preserve sequence integrity.

A scheduler 2300 sends Spackets belonging to various priorities or VCs over the satellite link. The scheduler is designed to be fair to VCs within a priority and between priorities as well. If the Spacket is to be compressed then it is sent to the Data Compressor 2400. The scheduler 2300 uses all the priority information for the various VCs and tries to be fair in the scheduling of the Spackets. A simple scheduling algorithm is to process all the high priority per-VC queues on a round-robin basis and then to process all the low priority per-VC queues on a round-robin basis. Another option for the scheduler would be to transmit at least one low priority cell every "n" high priority cells. This could assure some degree of fairness between priorities. A further option would be, within a priority, to use a weighted round-robin scheduling algorithm to transmit cells from per-VC queues, the weights reflecting the bandwidths that the VCs have subscribed for. This scheduling algorithm will attempt to schedule different VCs fairly.

Spackets which belong to a VC which has been specified to be compressed are compressed in data compressor 2400. To achieve loss-less data compression, the compression and decompression histories are reset every n. Spackets, where n is a configurable parameter. With the FEC, the link is maintained at a very low BER. If a Spacket does get corrupted, then the resetting of the histories, will ensure that not more than n Spackets are affected.

Figure 6C:
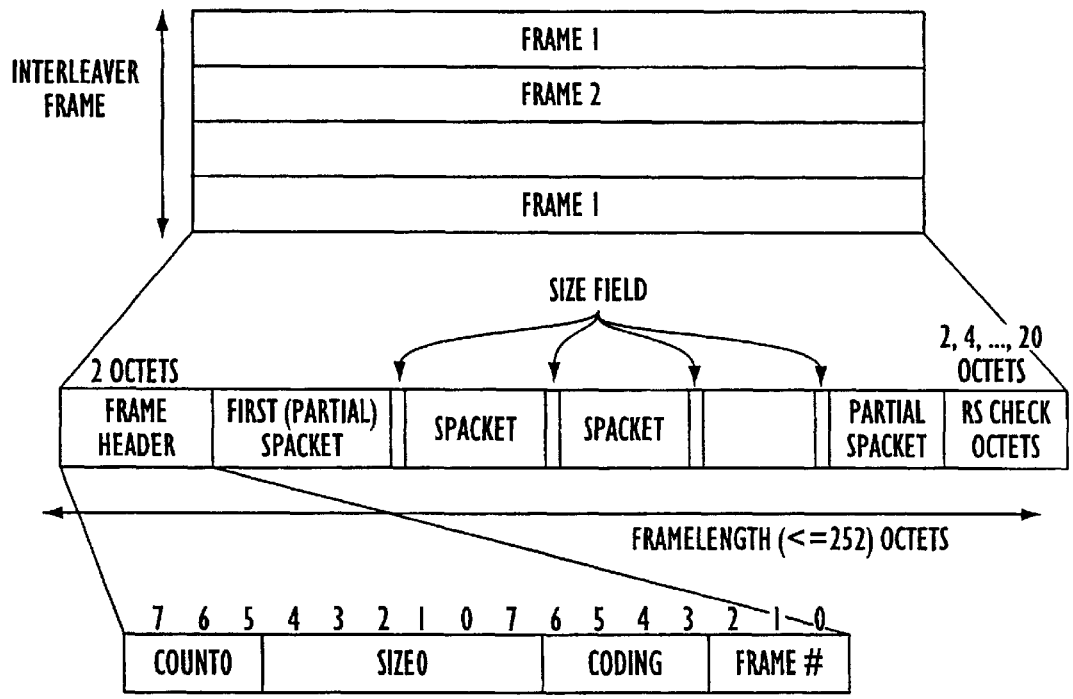
FIG. 6C illustrates a satellite/wireless frame structure that is applicable to a frame relay system.

Finally, the compressed or uncompressed Spackets are provided to a satellite/wireless frame processor 2501, which incorporates the Spackets into a frame for transmission over the satellite/wireless link. This frame structure has been designed to facilitate fast frame synchronization, accommodation of several variable-size packets, fast recovery from lost frames, very low bandwidth overhead, as well as dynamic Reed-Solomon coding change without introducing data loss during the coding rate change transition. FIG. 6C shows the frame format.

The fundamental unit of transmission over the satellite/wireless link is a fixed size frame, which is n octets long. If an interleaving depth of I is used, then I such frames are used to compose an "interleaver frame". The interleaver rearranges the order of the bytes in the interleaver frame and transmits each byte sequentially over the satellite/wireless link. It should be noted that there are no special synchronization bits in this frame structure.

Each frame is n bytes long and consists of:

---
a 2-octet header
followed by the frame payload, and
terminated by 2t octets (t > 0) of Reed-Solomon coding check bytes in the end.

--- terminated by 2t octets (t>0) of Reed-Solomon coding check bytes in the end.

TABLE 1

| | |
|---|---|
| Count0 | Number of Spackets in frame.<br>Does not include the first Spacket, if any<br>Includes the last Spacket, if any |
| Size0 | Size of first partial Spacket in frame divided by 4. |
| FrameNum | The frame number<br>Each frame is sequentially numbered 0, 1, . . . , 7, 0, . . . |
| Coding | If FrameNum > 3, the coding field represents the number of Reed-Solomon octets / 2 that will be used starting with the next frame numbered 0. Note that 0 is an invalid value for the coding field.<br>If FrameNum == 0, the coding field represents the suggested value of the number of Reed-Solomon octets / 2 that the other side should use for its own transmission. If the coding field value is 0xF, the value implies that the transmitting terminal is not yet synchronized to its receiving bit stream. Note that 0 is an invalid value for the coding field.<br>If FrameNum == 1, the least significant bit of the coding field is 1 if Spacket header compression is activated at the transmitting terminal, 0 otherwise. Other bits of the field are reserved for future use.<br>If FrameNum is 2 or 3, the coding field shall be set to 0's. |

The payload contains a combination of several variable-size packets (the packets may contain compressed or uncompressed Spackets).

The rules for filling a frame payload with Spackets are as follows:

1. If the previously transmitted frame contained a partial Spacket at the end of the payload, the frame payload currently being transmitted begins with the next portion of that Spacket. This portion shall consume min (4*size0, payload_size) octets of the payload, where size0=0. The actual size of this partial Spacket may be up to three octets less than 4*size0, in which case the extra octets shall be filled with zeroes.
2. After the initial partial Spacket segment, the payload contains count0 Spackets where count0=0. If the last Spacket cannot be entirely contained in the payload, then only its initial portion is included in the payload. Each Spacket is preceded by a 1-octet-length (in octets) field followed by the Spacket contents. The length field contains the size of the Spacket in bytes.
3. If there are any octets left over in the payload, then the first such unused octet shall contain a zero. The rest of the octets, if any, shall be filled sequentially with the numbers i, i+1, i+2, . . . , where i is the octet number of the first such octet in the payload (octets in the payload are implicitly numbered 0, 1, . . . ).

From these rules, one can see that a frame payload may contain several Spackets and that the Spackets can be transmitted over more than one frame. A frame with no Spackets contains the sequence 0, 1, 2, . . . in the payload. A Spacket may be split across more than two frames if required.

This frame structure design allows the possibility of dynamically changing the Reed-Solomon code size by correspondingly changing the payload size but keeping the frame size constant. If the receiver "loses" a frame, for example, due to excessive bit errors in the frame, the size0 field allows rapid determination of the Spacket boundary on the very next frame. The frame header, shown in FIG. 11C, has four fields which are described in Table 1, wherein the Reed-Solomon check-bytes are the check-bytes generated by a standard Reed-Solomon algorithm with frame size=N bytes and number of check bytes=2t.

During the time that the system has not achieved receive synchronization, it sets the Reed-Solomon code value of its receiver and its transmitter to the maximum value. After the system achieves receive synchronization and it detects that the remote terminal has also achieved receive synchronization (i.e., the coding field in the received frame header of frame number 0 contains a valid code value), it activates an adaptive coding algorithm.

Transmissions from the satellite/wireless network are received and processed by a Satellite/Wireless frame processor 2502, which performs the inverse operation of that performed by the frame processor 2501, strips the Spackets from the frame format and produces the compressed and un-compressed Spackets.

Next, compressed Spackets are sent to Data Decompression module 2600, which decompresses the Spackets belonging to a VC which has been configured to be compressed. Compression and decompression histories are maintained in the Data compressor 2400 and the decompressor 2600, respectively. These histories are reset once every n Spackets, where n is a configurable parameter. This is done to minimize the effect that a lost or erroneous Spacket has on the following Spackets.

A reassembly and resequencing processor 2700 keeps track of Spackets belonging to all the VCs. The reassembly algorithm works on a per-VC basis. The Spackets for each VC are resequenced based on the sequence and packet numbers. The following rules are used to reassemble frame relay packets:

If a Spacket with a sequence number of zero is received, discard any previous incompletely assembled frame relay packet and start reassembling this new packet.

If a Spacket with the same packet number and VC Id, with a sequence number one more than the previous Spacket is received, then append this Spacket to the partially reassembled frame relay packet. If the "last field" indicates that the Spacket is the last Spacket of a frame relay packet, the frame relay packet has been completely assembled.

If a Spacket with sequence number which is out of sequence, and non-zero, is received, discard this new Spacket and any partially reassembled frame relay packet.

If the packet number of the Spacket received is not the same as that of the previous Spacket and the sequence number of the received Spacket is not zero, discard this new Spacket and any partially reassembled frame relay packet.

Optionally, a length field could be added to the frame relay packet at the transmitting terminal before it is segmented and transmitted over the satellite/wireless link. This length field could be used at the receiving terminal to check if the frame relay packet has been reassembled properly. If it hasn't then the frame relay packet is added to the transmit queue.

A transmit queue 2800 contains frame relay packets received from the remote terminal which will be transmitted over the terrestrial link. These packets are processed by the frame relay physical and data link layer processing module and transmitted over the terrestrial link.

Finally, the frame relay physical and data link layer processing module 2000 will reassemble the Spackets in to the appropriate frame relay configuration for transmission over the private or public network.

In order to save bandwidth, an acquisition and synchronization technique, similar to that used for ATM transmissions as described previously, may be used for a variety of cell/packet based protocols, including frame relay and Internet transmissions where, typically, extra framing bits are used for acquisition and synchronization. The application of the present technique provides for a more robust system under the high error conditions encountered in satellite/wireless transmissions, where sync loss and packet error are common problems.

Although certain preferred embodiments of the present invention have been described, the spirit and scope of the invention is not restricted to that which is described above and it is the claims which are relied upon to define the present invention in accordance with applicable principles of law.

What is claimed is:

1. A communication system for transmitting cell/packet-formatted signals comprising at least two local area networks that are connected by a wireless communication link, each network comprising:
    (a) a switch for switching cell/packets for providing a plurality of cell/packets, each cell/packet comprising a header portion and a payload portion; and
    (b) an interconnect apparatus which provides a means of interconnecting said switch over the communication link, said interconnect apparatus comprising:
        (i) means for processing, in whole or in part, each cell/packet in said plurality of cell/packets to at least separate said header portion from said payload portion and filter said cell/packets on the basis of predetermined criteria;
        (ii) means for compressing at least said payload portion;
        (iii) first queue means for receiving at least said compressed payload portion and assembling said compressed portions into high and low priority queues;
        (iv) means for assembling the content of said high and low priority queues into fixed sized assembled frames on a predetermined basis, said fixed sized assembled frames comprising a frame header, a data payload and a code, wherein said frame header comprises a plurality of parameters including parameters relating to cell/packet count per frame, size of partial cell/packet space, frame number and coding; and
    (c) means for transmitting said fixed sized assembled frame,
        wherein, said interconnect apparatus further comprises means for filling an entire payload in a frame with a sequence of predetermined numbers useable for acquisition.

2. A communication system as set forth in claim 1 wherein at least one network further comprises encoding means for encoding said fixed sized assembled frame and at least the other network comprises decoding means for decoding said fixed sized assembled frame.

3. A communication system as set forth in claim 1 wherein at least one network further comprising an interleaver for interleaving a plurality of said fixed sized assembled frames and at least said other network comprises deinterleaving means for deinterleaving interleaved frames.

4. A communication system as set forth in claim 1 wherein at least one network further comprises an interface to the wireless communication link.

5. A communication system as set forth in claim 1 wherein each network further comprises:
    (d) means for receiving transmitted frames from said wireless communication link;
    (e) a frame disassembler for disassembling said transmitted frames into a plurality of cell/packets; and
    (f) a second queue means for holding said cell/packets for transmission to a cell/packet switch, and
        wherein said means for receiving further comprises a means for detecting said sequence of predetermined numbers and for enabling acquisition.

6. A communication system as set forth in claim 5, wherein said means for receiving is further operative to locate a frame boundary for synchronization on the basis of at least said detected sequence of numbers.

7. A communication system as set forth in claim 5, wherein said interconnect apparatus further comprises:
    means for encoding transmitted frames and decoding received frames.

8. A communication system as set forth in claim 1, wherein said entire payload in a frame has no complete or partial cell/packets when used for acquisition.

9. The communication system as set forth in claim 1, wherein said cell/packets comprise at least one of ATM cells, Internet packets and frame relay packets.

* * * * *